(12) United States Patent
Shvydun et al.

(10) Patent No.: US 9,304,535 B2
(45) Date of Patent: Apr. 5, 2016

(54) BAUD RATE PHASE DETECTOR WITH NO ERROR LATCHES

(71) Applicant: LSI Corporation, San Jose, CA (US)

(72) Inventors: Volodymyr Shvydun, Los Altos, CA (US); Adam B. Healey, Newburyport, MA (US); Chaitanya Palusa, Fremont, CA (US); Hiep T. Pham, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 253 days.

(21) Appl. No.: 14/222,157

(22) Filed: Mar. 21, 2014

(65) Prior Publication Data

US 2015/0234423 A1      Aug. 20, 2015

Related U.S. Application Data

(60) Provisional application No. 61/940,559, filed on Feb. 17, 2014.

(51) Int. Cl.
| | |
|---|---|
| G06F 1/12 | (2006.01) |
| G06F 7/00 | (2006.01) |
| H04L 7/033 | (2006.01) |
| H04L 27/26 | (2006.01) |
| H03L 7/091 | (2006.01) |
| H04L 27/227 | (2006.01) |
| H04L 27/00 | (2006.01) |
| H04L 27/06 | (2006.01) |
| H04L 25/02 | (2006.01) |
| H03L 7/087 | (2006.01) |

(52) U.S. Cl.
CPC . *G06F 1/12* (2013.01); *H03L 7/087* (2013.01); *H03L 7/091* (2013.01); *H04L 7/0338* (2013.01); *H04L 25/022* (2013.01); *H04L 27/066* (2013.01); *H04L 27/2275* (2013.01); *H04L 27/2695* (2013.01); *H04L 2027/0067* (2013.01)

(58) Field of Classification Search
CPC ............. H04L 25/022; H04L 27/2275; H04L 27/2695; H04L 7/0338; H04L 27/066; H04L 2027/0067; G06F 1/12; H03L 7/087; H03L 7/091
USPC .......................................... 713/400, 500, 501
See application file for complete search history.

(56) References Cited

U.S. PATENT DOCUMENTS

| | | | |
|---|---|---|---|
| 5,832,045 A | 11/1998 | Barber | |
| 5,920,220 A * | 7/1999 | Takao | ................... H04L 7/0054 327/141 |
| 7,310,397 B2 | 12/2007 | Smith et al. | |
| 7,936,193 B2 | 5/2011 | Van Der Wel et al. | |
| 2014/0219396 A1* | 8/2014 | Svensson | .............. H04L 7/0054 375/320 |

* cited by examiner

*Primary Examiner* — Michael J Brown

(57) ABSTRACT

Phase detectors and timing recovery techniques that do not require error latches nor oversampling of the received input data are disclosed. The phase detection method includes separating an input signal into N consecutive data bits; comparing at least two consecutive data bits within the N consecutive data bits; estimating a data bit value for each of the N consecutive data bits; and determining a phase difference based on a data bit pattern formed by the data bit values of the N consecutive data bits and the comparison of the at least two consecutive data bits within the N consecutive data bits.

20 Claims, 4 Drawing Sheets

BAUD RATE PHASE DETECTOR WITH NO ERROR LATCHES

CROSS-REFERENCE TO RELATED APPLICATIONS

The present application claims the benefit under 35 U.S.C. §119(e) of U.S. Provisional Application Ser. No. 61/940,559, filed Feb. 17, 2014. Said U.S. Provisional Application Ser. No. 61/940,559 is hereby incorporated by reference in its entirety.

TECHNICAL FIELD

The present invention relates to the field of communication systems and particularly to phase detectors utilized in communication systems.

BACKGROUND

A phase detector or phase comparator is a device that generates a voltage signal which represents the difference in phase between two or more signal inputs. Detecting phase difference is very important in many applications, such as in communication systems and the like.

SUMMARY

Accordingly, an embodiment of the present disclosure is directed to a phase detector. The phase detector includes a signal processor configured to separate an input signal into N consecutive data bits and a comparator configured to compare at least two consecutive data bits within the N consecutive data bits. The phase detector also includes a set of N estimation modules each configured to estimate a data bit value for each of the N consecutive data bits and a computing module configured to determine a phase difference based on a data bit pattern formed by the data bit values of the N consecutive data bits and said comparison of the at least two consecutive data bits within the N consecutive data bits.

A further embodiment of the present disclosure is also directed to a communication apparatus. The communication apparatus includes a signal processor configured to separate an input signal into N consecutive data bits and a comparator configured to compare at least two consecutive data bits within the N consecutive data bits. The communication apparatus also includes a set of N estimation modules each configured to estimate a data bit value for each of the N consecutive data bits, a computing module configured to determine a phase difference based on a data bit pattern formed by the data bit values of the N consecutive data bits and said comparison of the at least two consecutive data bits within the N consecutive data bits, and a phase adjuster configured to adjust a timing signal at least partially based on the determined phase difference.

An additional embodiment of the present disclosure is directed to a phase detection method. The method includes: separating an input signal into N consecutive data bits; comparing at least two consecutive data bits within the N consecutive data bits; estimating a data bit value for each of the N consecutive data bits; and determining a phase difference based on a data bit pattern formed by the data bit values of the N consecutive data bits and said comparison of the at least two consecutive data bits within the N consecutive data bits.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

A clock and data recovery (CDR) circuit is an essential block in many data transmission applications such as communications systems, backplane data-link routing, chip-to-chip interconnection and the like. Data streams in such applications, especially high-speed serial data streams are sent without an accompanying clock signal. The receiver therefore needs to generate a clock from an approximate frequency reference and then phase-align to the transitions in the data stream. This process is commonly known as clock and data recovery.

Figure 1:
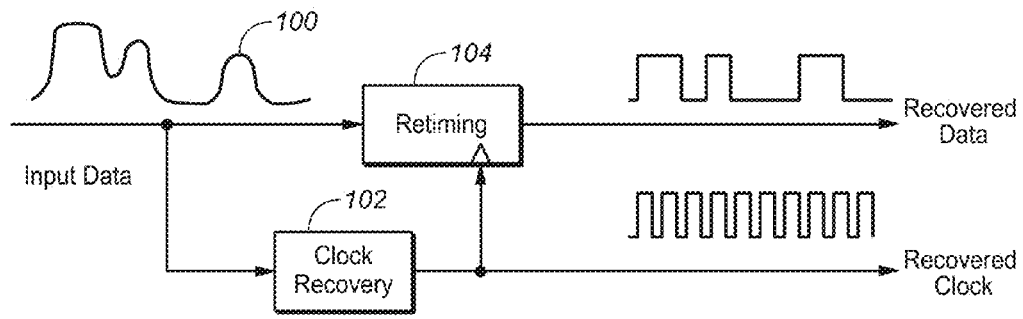
FIG. 1 is a functional diagram of clock recovery and data retiming using a clock and data recovery circuit.

FIG. 1 is a simplified functional diagram of clock recovery and data retiming using a CDR circuit. The important role of a CDR 102 is to extract the transmitted data sequence from the distorted received signal 100 and to recover the associated clock timing information. The clock recovery circuit 102 detects the transitions in the received data 100 and generates a periodic clock, which is then used by the retiming unit 104 to phase-align to the transitions to produce the output data stream.

Conventional clock and data recovery methods rely either on data transitions to recover the clock by oversampling the received signal, which is very expensive (in terms of hardware and power) in high speed serial communication systems, or rely on baud rate (synonymous to symbols per second or pulses per second) sampling by using the minimum mean squared error algorithm (MMSE). MMSE based timing recovery monitors one or more signal levels and adjusts the clock phase such that maximum vertical data eye opening is achieved. While baud rate sampling is more preferable than oversampling, traditional MMSE based phase detectors require at least two comparators and error latches. These comparators also require reference voltages that need to be obtained from some eye monitor/adaptation circuit. All these components complicate the phase detector configuration and increase power consumption.

Embodiments of the present disclosure are directed to phase detection and timing recovery techniques that do not require error latches nor oversampling of the received input data. Since error latches are power hungry and oversampling of the input data is wasteful, eliminating the need for error latches and oversampling improves the efficiency and reduces power consumption of phase detection. The techniques in accordance with embodiments of the present disclosure are applicable in communication systems/receivers where samples are parallelized and the parallelization factor is 4 or greater.

Figure 2:
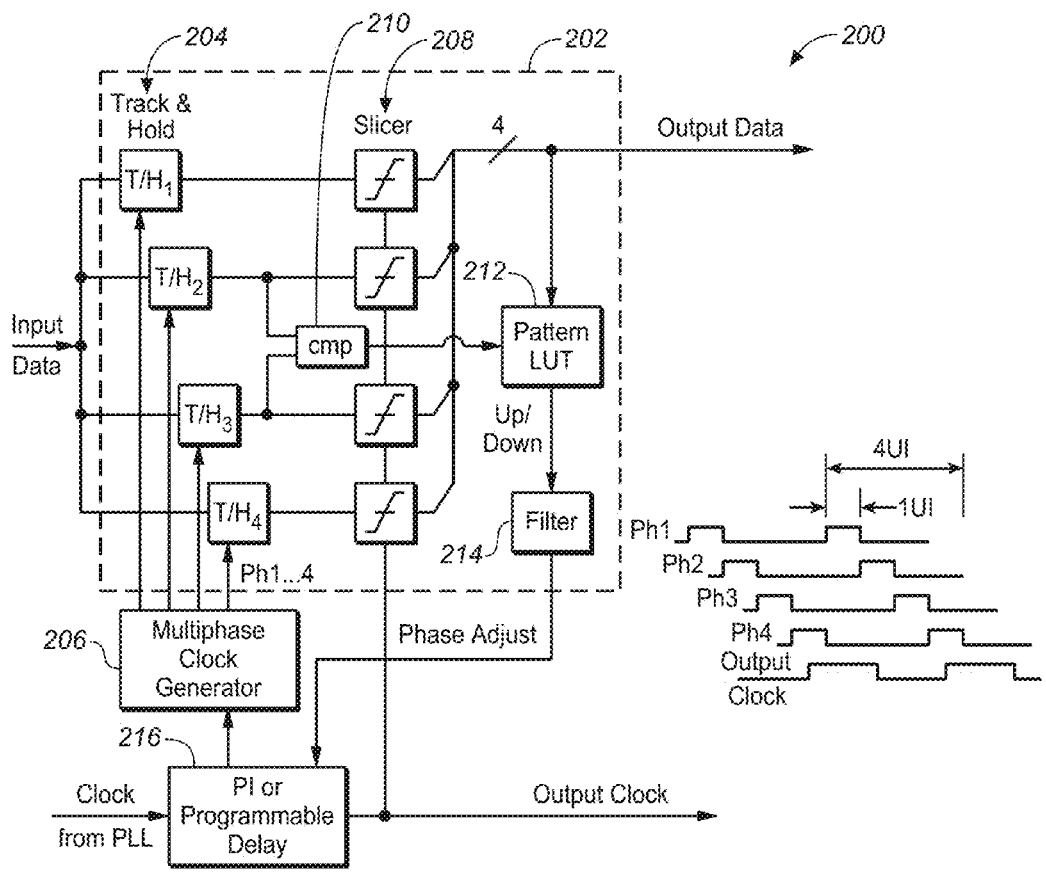
FIG. 2 is a schematic depicting a clock and data recovery circuit utilizing a phase detector.

Referring to FIG. 2, a schematic depicting a clock and data recovery (CDR) circuit 200 utilizing a phase detector 202 in accordance with one embodiment of the present disclosure is shown. In the embodiment depicted in FIG. 2, a 4-way time-interleaved track and hold (or sample and hold) circuit 204 is utilized at the front end to sample the analog input signal received. A multiphase clock generator 206 is utilized to generate the interleaving clock phases (denoted as Ph1, Ph2, Ph3 and Ph4) for the time-interleaved track and hold circuit 204 (denoted as T/H1, T/H2, T/H3 and T/H4, respectively). It is noted that the interleaving clock phases are each shifted by one unit of interval (1 UI).

Utilizing such a time-interleaved track and hold circuit 204, the input signal is sampled and four consecutive data bits are memorized in four track and hold circuitries. More specifically, in this example, every phase signal enables the track and hold circuitries to perform tracking of the input signal for 1 unit of interval and to hold the value for the next 3 units of interval. Every track and hold circuitry is followed by a corresponding slicer 208, which produces a decision (i.e., sliced data) based on the value held by its corresponding track and hold circuitry. In this 4-way time-interleaved configuration, the output clock period is 4 units of interval and output data is 4 bits per clock.

It is the job of the phase detector 202 to determine whether any phase shift adjustment is needed. This is performed based on the sliced data provided by the slicers 208 and a comparison result provided by a comparator 210. In the 4-way time-interleaved configuration depicted in FIG. 2, the comparator 210 is configured to compare values from the two track and hold circuitries in the middle, denoted as T/H2 and T/H3 in the figure. Because the track and hold circuitries hold values of consecutive data bits, the two track and hold circuitries in the middle (T/H2 and T/H3) represent the two bits in the middle of the 4-bit output data. It is noted that the first and the last bits in the output data are not utilized in this comparison.

Figure 3:
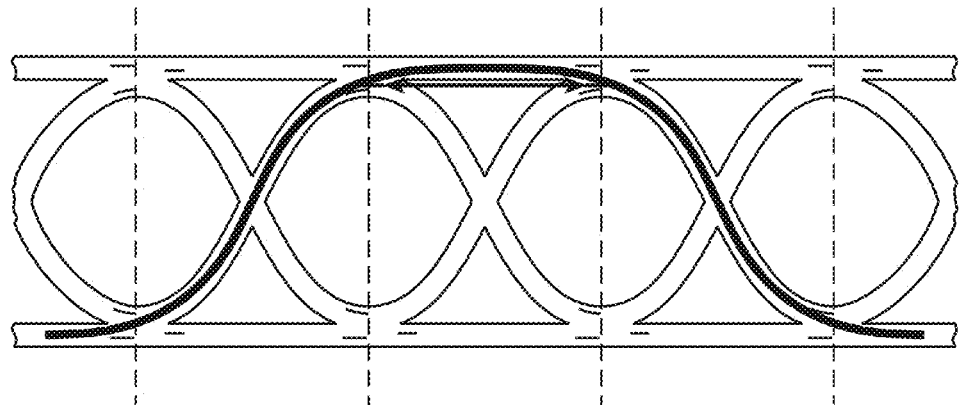
FIG. 3 is an illustration depicting an ideal sampling condition on a signal trajectory for a 0110 data pattern.
Figure 4:
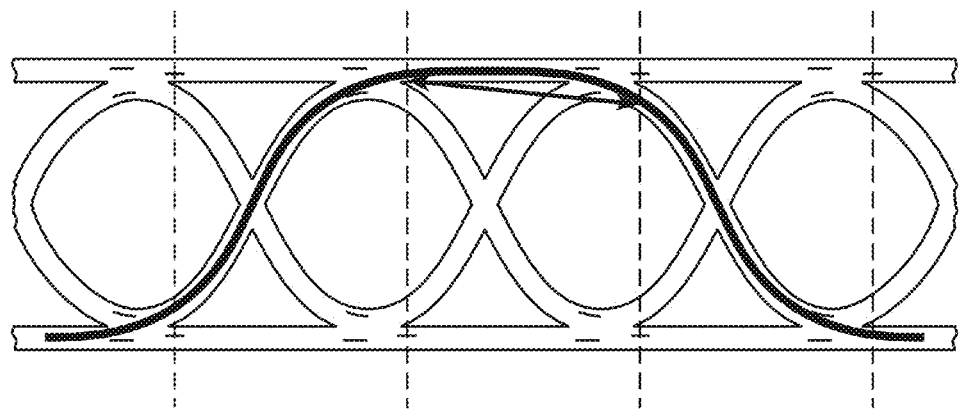
FIG. 4 is an illustration depicting a late sampling condition on a signal trajectory for a 0110 data pattern.
Figure 5:
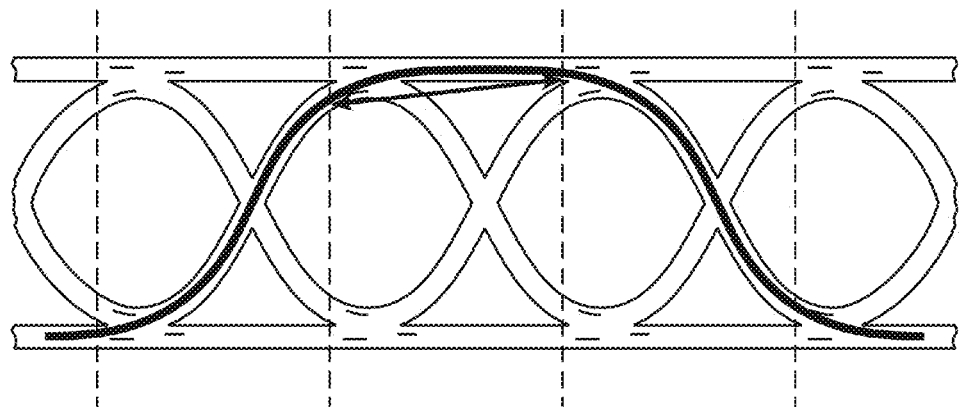
FIG. 5 is an illustration depicting an early sampling condition on a signal trajectory for a 0110 data pattern.

The purpose of this comparison is to determine whether early sampling or late sampling has occurred. This is further illustrated in FIGS. 3-5. More specifically, FIG. 3 depicts an ideal sampling condition on a signal trajectory for a 0110 data pattern, where the values corresponding to the two middle bits are substantially the same, and the comparator 210 should indicate substantially 0 change between the two. FIG. 4 depicts a late sampling condition, where the values corresponding to the two middle bits differ, and the comparator 210 should indicate a decrease from the second bit to the third bit. On the other hand, FIG. 5 depicts an early sampling condition, where the values corresponding to the two middle bits also differ, and the comparator 210 should indicate an increase from the second bit to the third bit.

Figure 6:
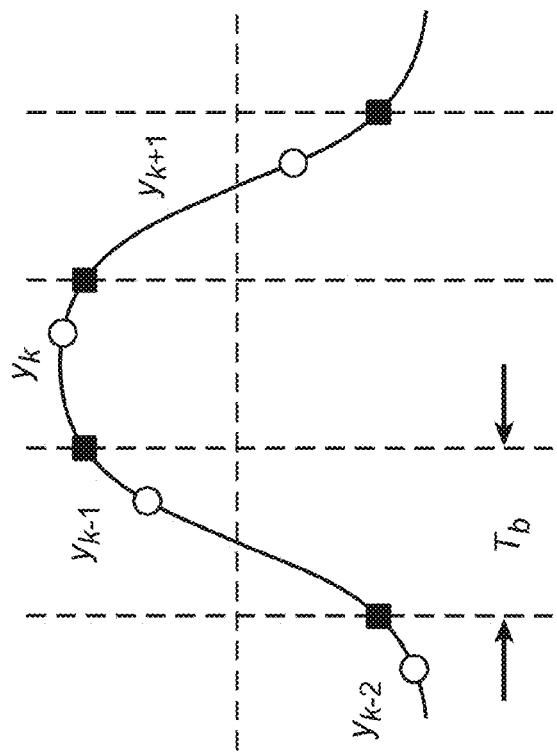
FIG. 6 is an illustration depicting sampling on a signal trajectory for a 0110 data pattern.

FIG. 6 generalizes the signal trajectory for the 0110 data pattern as depicted above. That is, let $y_{k-2}$, $y_{k-1}$, $y_k$, and $y_{k+1}$ denote the actual points where the input data y is sampled. These sampled data will then be sliced by the slicers 208 to produce the sliced data $\hat{x}_{k-2}$, $\hat{x}_{k-1}$, $\hat{x}_k$, and $\hat{x}_{k+1}$, respectively. As shown in FIGS. 3-5, the delta (i.e., difference) value between $\hat{x}_{k-1}$ and $\hat{x}_k$, provided by the comparator 210, will then uniquely identify whether early sampling or late sampling has occurred. This comparison result can be used to adjust the phase shift signal accordingly to reduce either early sampling or late sampling.

Figure 7:
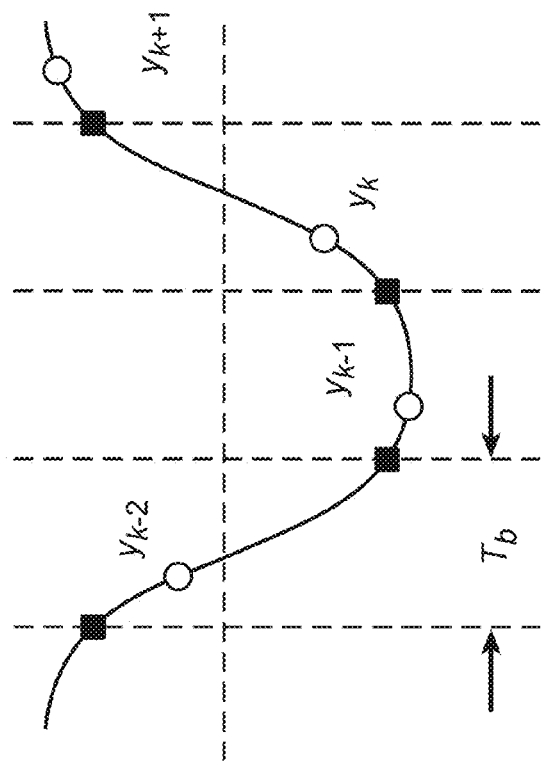
FIG. 7 is an illustration depicting sampling on a signal trajectory for a 1001 data pattern.

Similarly, the comparator 210 is also applicable to determine whether early sampling or late sampling has occurred for a 1001 data pattern. Referring to FIG. 7, which generalizes the signal trajectory for the 1001 data pattern. Following the same notation used in FIG. 6, that is, let $y_{k-1}$, $y_{k-1}$, $y_k$, and $y_{k+1}$ denote the actual points where the input data y is sampled. These sampled data will then be sliced by the slicers 208 to produce the sliced data $\hat{x}_{k-2}$, $\hat{x}_{k-1}$, $\hat{x}_k$, and $\hat{x}_{k+1}$, respectively, and the comparator 210 can then uniquely identify whether early sampling or late sampling has occurred for this 1001 data pattern.

Utilizing the techniques described above, the phase detector 202 is able determine, utilizing a computing module, whether the phase signal should be shifted up or down based on the comparator 210 output and the sliced data value from the slicers 208. In the example described above, the following rule can be applied:

| $\hat{x}_{k-2}$ | $\hat{x}_{k-1}$ | $\hat{x}_k$ | $\hat{x}_{k+1}$ | $\hat{x}_k - \hat{x}_{k-1}$ | Adjustment |
|---|---|---|---|---|---|
| 1 | 0 | 0 | 1 | <0 | Down |
| 1 | 0 | 0 | 1 | >0 | Up |
| 0 | 1 | 1 | 0 | <0 | Up |
| 0 | 1 | 1 | 0 | >0 | Down |
| All other conditions | | | | | No shift |

That is, if the data sampled is a 0110 pattern, and if $\hat{x}_k - \hat{x}_{k-1} < 0$, a late sampling (as depicted in FIG. 4) is detected and the phase signal should be shifted up towards the ideal condition. In another example, if the data sampled is a 1001 pattern, and if $\hat{x}_k - \hat{x}_{k-1} < 0$, an early sampling is detected and the phase signal should be shifted down towards the ideal condition. It is understood that the other rules indicated above are applied in the same manner. It is also understood that, according to the rules defined above, 1) if the data sample is not a 1001 or a 0110 pattern, or 2) if $\hat{x}_{-1}$ and $\hat{x}_k$ are substantially the same (e.g., the difference between them is below a threshold, and the sampling condition is therefore acceptable), then no adjustment is needed. It is contemplated, however, that the rules defined above is merely exemplary, and specific rules may differ without departing from the spirit and scope of the present disclosure.

It is contemplated that the phase detector 202 can determine the adjustment utilizing the rules defined above, or alternatively, the phase detector 202 can utilizes a pattern look up table 212 to look up the predetermined output value (up, down, or no shift) based on input values $\hat{x}_{k-2}$, $\hat{x}_{k-1}$, $\hat{x}_k$, and $\hat{x}_{k+1}$ from the slicers 208 and $\hat{x}_k - \hat{x}_{k-1}$ from the comparator 210. It is contemplated that various types of storage devices can be utilized to store the look up table 212 without departing from the spirit and scope of the present disclosure.

It is also contemplated that the phase detector 202 can utilize a filter 214 to filter the adjustment noises. In one embodiment, the filter 214 includes an accumulator to keep a running average of the adjustment output. For instance, let each shift up signal carry a weight of 1, let each shift down signal carry a weight of −1, and let each no shift signal carry a weight of 0; a running average of the adjustment values can be calculated and sent to a phase adjuster (e.g., programmable delay) 216 to adjust the timing. Using the exemplary weight assignment described above, the programmable delay 216 can shift the phase up or down based on whether the averaged adjustment value is positive or negative, respectively. It is contemplated, however, that various other types of filters may be utilized to remove adjustment noises without departing from the spirit and scope of the present disclosure.

Figure 8:
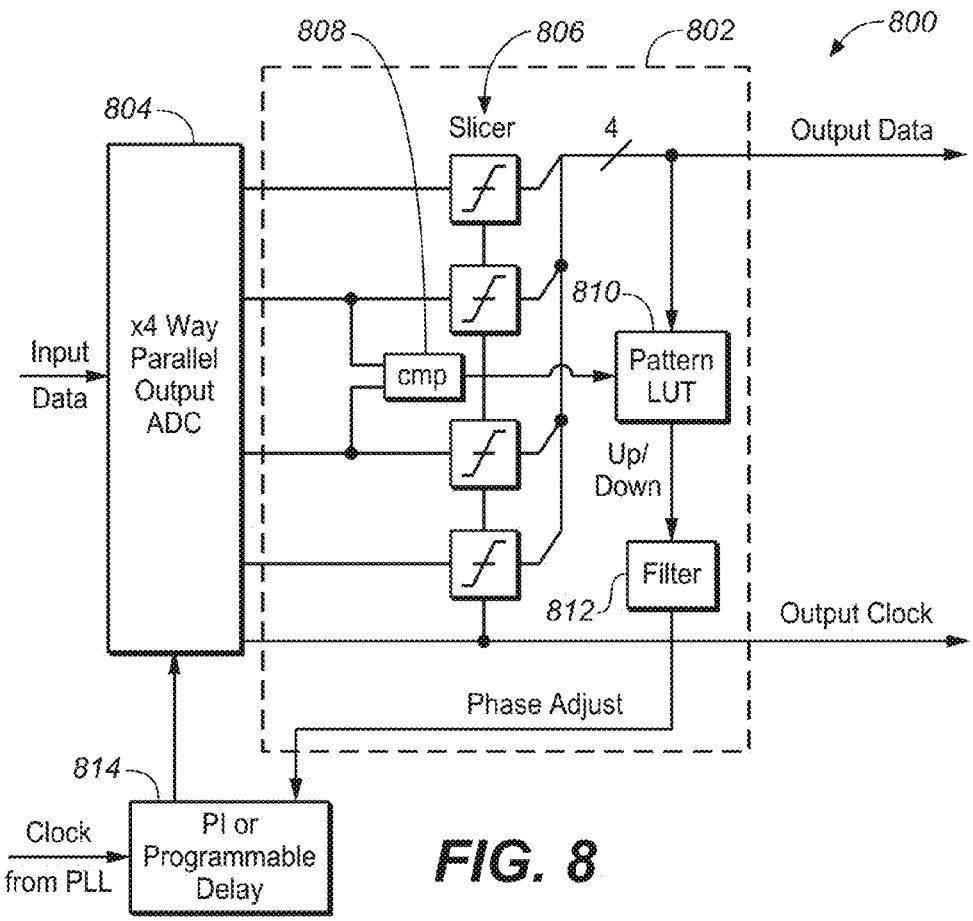
FIG. 8 is a schematic depicting an analog-to-digital convertor based receiver utilizing a phase detector.

It is further contemplated that the phase detection techniques as described above are also applicable in digital domain. For instance, as illustrated in FIG. 8, an analog-to-digital convertor (ADC) based receiver 800 utilizing a phase detector 802 in accordance with one embodiment of the present disclosure is shown. Instead of using time-interleaved track and hold circuits as shown in FIG. 2, a parallel output ADC 804 is utilized to provide four consecutive data bits to the digital slicers 806. A digital comparator 808 with a predefined threshold value is used to compare the middle two data bits in a similar manner as described above, and the same process is used to determine whether early sampling or late sampling has occurred based on input values $\hat{x}_{k-2}$, $\hat{x}_{k-1}$, $\hat{x}_k$, and $\hat{x}_{k+1}$ from the slicers 806 and $\hat{x}_k - \hat{x}_{k-1}$ from the comparator 810. Similarly, a look up table 810 and a filter 812 can be utilized in the same manner as previously described, and the output of the phase detector 802 is provided to a phase adjuster (e.g., programmable delay) 814 to adjust the phase signal.

Now, while the interleaving (parallelization) factor in the examples described above is 4, it is understood that such a factor is merely exemplary and the phase detection techniques previously described are applicable in communication systems where interleaving (parallelization) factors are greater than 4. For instance, if five (5) consecutive data bits are sampled, denoted as $\hat{x}_{k-2}$, $\hat{x}_{k-1}$, $\hat{x}_k$, $\hat{x}_{k+1}$ and $\hat{x}_{k+2}$, two comparators can be utilized to compare the middle bits $\hat{x}_{k-1}$ against $\hat{x}_k$ and $\hat{x}_k$ against $\hat{x}_{k+1}$. Similarly, rules (or a look up table) can be defined to determine whether early sampling or late sampling has occurred based on input values $\hat{x}_{k-2}$, $\hat{x}_{k-1}$, $\hat{x}_k$, $\hat{x}_{k+1}$ and $\hat{x}_{k+2}$ as well as comparison values $\hat{x}_k - \hat{x}_{k-1}$ and $\hat{x}_{k+1} - \hat{x}_k$. It is contemplated that interleaving (parallelization) factors greater than 5 can be provided in the similar manner, and it is noted that regardless of the specific interleaving (parallelization) factor used in a particular implementation, the phase detector operates under the same sample rate as the data rate (i.e., baud rate without oversampling) and does not use any error latches.

It is contemplated that the phase detectors in accordance with embodiments of the present disclosure can be incorporated into communication devices operating in either analog or digital domain to provide baud rate phase detection without error latches. Such devices may include, for example, serializer-deserializer (SerDes) receivers, or any receivers and/or transceivers in general. It is contemplated that the phase detectors in accordance with embodiments of the present disclosure can be fabricated in an integrated circuit and can also be incorporated in to any data processing devices that process data streams without departing from the spirit and scope of the present disclosure.

Figure 9:
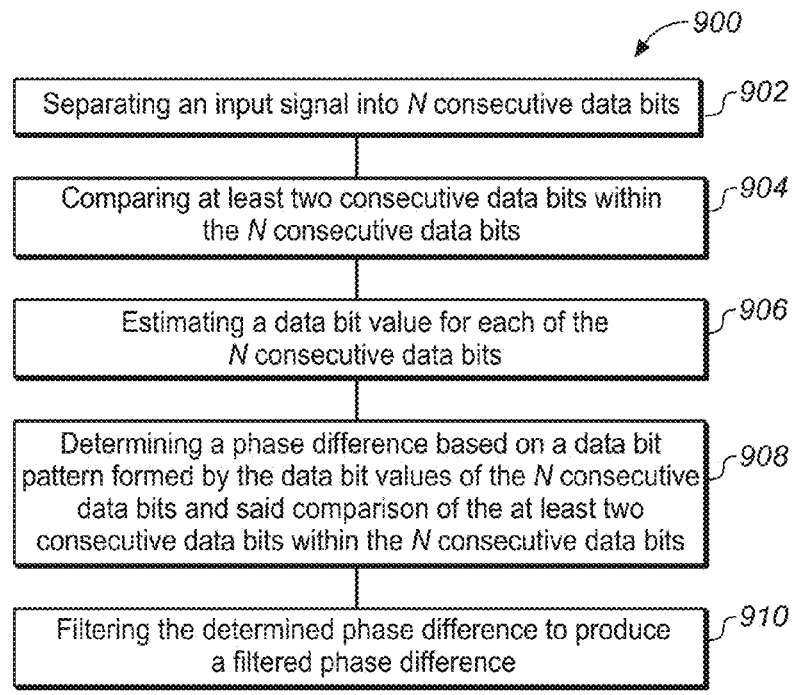
FIG. 9 is a flow diagram illustrating a method for baud rate phase detection.

Referring to FIG. 9, a flow diagram illustrating a method 900 for baud rate phase detection without using error latches is shown. Upon receiving an input signal, a signal processor is utilized to separate/parallelize the input signal into N consecutive data bits in step 902. In one embodiment, the signal processor includes N time-interleaved track and hold circuits that sample the input signal with clocks of different phases. For instance, the clock signals can be set to 1/N data rate, shifted by 1 T, where 1 T is time of one bit in the transmission channel (i.e., $$\frac{1}{\text{data rate}}).$$

Each one of the N time-interleaved signals is then fed to a corresponding track and hold circuit, which tracks (samples) and holds the value of its received signal at a constant level for up to N units of time. Alternatively, the signal process utilizes an N-way parallel output digital converter to provide N parallelized data bits as digital signals.

Each of the N consecutive data bits is then provided to a corresponding estimation module in step 904. Each estimation module includes a slicer and/or a decision equalizer or the like to estimate one of the N data bits based on the sampled value it received. In addition, at least one comparator is also utilized to compare sampled values corresponding to two consecutive data bits in step 906. As previously described, the first and the last data bits in the N consecutive data bits are excluded from the comparison.

Once the estimated values of each of the N consecutive data bits and the comparison results are determined, a determination is made by a computing module in step 908 as to whether sampling conditions such as early sampling or late sampling has occurred based on a set of predetermined rules. More specifically, if the estimated values of each of the N consecutive data bits matches with a certain data pattern, then the occurrence of early sampling or late sampling can be uniquely determined based on the comparison results. On the other hand, if no data pattern is matched, neither early sampling nor late sampling is reported. In certain embodiments, the determination made in step 908 is further filtered in step 910 to limit the amount of noises, as previously described.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A phase detector, comprising:
   a signal processor configured to separate an input signal into N consecutive data bits;
   a comparator configured to compare at least two consecutive data bits within the N consecutive data bits;
   a set of N estimation modules each configured to estimate a data bit value for each of the N consecutive data bits; and
   a computing module configured to determine a phase difference based on a data bit pattern formed by the data bit values of the N consecutive data bits and said comparison of the at least two consecutive data bits within the N consecutive data bits.

2. The phase detector of claim 1, wherein a first bit and a last bit of the N consecutive data bits are excluded from said comparison.

3. The phase detector of claim 1, wherein said phase difference indicates one of: an early sampling condition, a late sampling condition and an acceptable sampling condition.

4. The phase detector of claim 1, wherein the computing module utilizes a look up table to match against the data bit pattern formed by the data bit values of the N consecutive data bits and said comparison of the at least two consecutive data bits within the N consecutive data bits.

5. The phase detector of claim 1, further comprising:
   a filter configured to filter the phase difference to produce a filtered phase difference.

6. The phase detector of claim 1, wherein said signal processor includes at least one of:
   a set of N time-interleaved track-and-hold circuits configured to sample the input signal with a set of N phase shifted clock signals; and
   a N-way parallel analog-to-digital convertor configured to separate the input signal.

7. The phase detector of claim 1, wherein the phase detector is fabricated in an integrated circuit.

8. The phase detector of claim 1, wherein the phase detector is an integrated component of at least one of: a receiver and a transceiver.

9. The phase detector of claim 1, wherein the phase detector is an integrated component of at least one of: a serializer-deserializer receiver and a serializer-deserializer transceiver.

10. A communication apparatus, comprising:
    a signal processor configured to separate an input signal into N consecutive data bits;
    a comparator configured to compare at least two consecutive data bits within the N consecutive data bits;
    a set of N estimation modules each configured to estimate a data bit value for each of the N consecutive data bits;
    a computing module configured to determine a phase difference based on a data bit pattern formed by the data bit values of the N consecutive data bits and said comparison of the at least two consecutive data bits within the N consecutive data bits; and
    a phase adjuster configured to adjust a timing signal at least partially based on the determined phase difference.

11. The communication apparatus of claim 10, wherein a first bit and a last bit of the N consecutive data bits are excluded from said comparison.

12. The communication apparatus of claim 10, wherein said phase difference indicates one of: an early sampling condition, a late sampling condition and an acceptable sampling condition.

13. The communication apparatus of claim 10, further comprising:
    a filter configured to filter the phase difference to produce a filtered phase difference.

14. The communication apparatus of claim 10, wherein said signal processor includes at least one of:
    a set of N time-interleaved track-and-hold circuits configured to sample the input signal with a set of N phase shifted clock signals; and
    a N-way parallel analog-to-digital convertor configured to separate the input signal.

15. The communication apparatus of claim 10, wherein the communication apparatus is fabricated in an integrated circuit.

16. The communication apparatus of claim 10, wherein the communication apparatus includes at least one of: a receiver and a transceiver.

17. The communication apparatus of claim 10, wherein the communication apparatus includes at least one of: a serializer-deserializer receiver and a serializer-deserializer transceiver.

18. A phase detection method, comprising:
    separating an input signal into N consecutive data bits;
    comparing at least two consecutive data bits within the N consecutive data bits;
    estimating a data bit value for each of the N consecutive data bits; and
    determining a phase difference based on a data bit pattern formed by the data bit values of the N consecutive data bits and said comparison of the at least two consecutive data bits within the N consecutive data bits.

19. The method of claim 18, further comprising:
    filtering the determined phase difference to produce a filtered phase difference; and
    utilizing the filtered phase difference for phase adjustment.

20. The method of claim 18, wherein said separating an input signal into N consecutive data bits further comprising at least one of:
    sampling the input signal utilizing a set of N time-interleaved track-and-hold circuits; and
    separating the input signal utilizing a N-way parallel analog-to-digital convertor.

* * * * *